United States Patent [19]

Nakamura

[11] Patent Number: 5,036,297
[45] Date of Patent: Jul. 30, 1991

[54] HIGH-SPEED DIGITAL PLL DEVICE

[75] Inventor: Seizo Nakamura, Tokyo, Japan

[73] Assignee: Oki Electric Industry Co., Ltd., Tokyo, Japan

[21] Appl. No.: 578,555

[22] Filed: Sep. 6, 1990

[30] Foreign Application Priority Data

Sep. 8, 1989 [JP] Japan .................. 1-231489

[51] Int. Cl.$^5$ .................. H03L 7/06; H03L 7/081
[52] U.S. Cl. .................. 331/17; 331/34; 375/120
[58] Field of Search .................. 331/1 A, 16, 25, 17, 331/18, 34; 455/260; 375/81, 120

[56] References Cited

U.S. PATENT DOCUMENTS

| 3,509,471 | 4/1970 | Puente | 328/55 |
|---|---|---|---|
| 4,336,505 | 6/1982 | Meyer | 331/1 R |
| 4,617,679 | 10/1986 | Brooks | 375/119 |
| 4,873,491 | 10/1989 | Wilkins | 331/25 X |
| 4,912,433 | 3/1990 | Motegi et al. | 331/8 |
| 4,937,846 | 6/1990 | Malka et al. | 377/39 |

FOREIGN PATENT DOCUMENTS

| 377874 | 5/1985 | Austria . |
| 351072 | 1/1990 | European Pat. Off. . |
| 2214946 | 10/1972 | Fed. Rep. of Germany . |
| 3605991 | 9/1986 | Fed. Rep. of Germany . |
| 3843262 | 6/1990 | Fed. Rep. of Germany . |
| 63-304720 | 12/1988 | Japan . |
| 1425572 | 2/1976 | United Kingdom . |
| 2047996 | 12/1980 | United Kingdom . |
| 2197553 | 5/1988 | United Kingdom . |

OTHER PUBLICATIONS

Masayasu Hata, et al., "How to Use PLL-IC", *Akiba Shuppan*, (1986) p. 139.

Primary Examiner—David Mis
Attorney, Agent, or Firm—Edward D. Manzo

[57] ABSTRACT

In a device for producing a signal in synchronism with the phase of an input signal, a tapped delay timer produces a plurality of signals which have phases different from each other, a selection circuit selectively outputs the output signals of the tapped delay circuit, a frequency divider frequency-divides the output signal of the selection signal, a phase comparator compares the phases of the input digital signal and the output signal of the frequency divider, and a control circuit controls the selection circuit in accordance with the output of the phase comparator, so as to make the phase of the output signal of the frequency-divider to coincide with the input digital signal. A low-pass filter is provided to remove the hazard that is generated in the selection circuit. A waveform shaping circuit is provided to shape the waveform of the output signal of the low-pass filter into rectangular waveform.

7 Claims, 3 Drawing Sheets

HIGH-SPEED DIGITAL PLL DEVICE

FIELD OF THE INVENTION

The present invention relates to a high-speed digital PLL device which has alleviated the effect of the delay time of a digital circuit element.

BACKGROUND OF THE INVENTION

Digital PLL devices are widely used in digital telecommunication, and are present in various types. One of them is a digital PLL device having a phase switching and frequency dividers, which is introduced in "How to Use PLL-IC", by Masayasu Hata, Keisuke Furukawa, Feb. 10, 1986, Akiba Shuppan, page 139.

FIG. 2 is block diagram showing an example of this type of conventional digital PLL device. In FIG. 2, 1 is an input terminal, 2 is a phase comparator, 3 is a low-pass filter such as a random walk filter, 4 is a control circuit, 5 is an oscillator, 6 is a tapped delay circuit, 7 is a selection circuit, 8 is a delay circuit, 9 is a frequency divider, and 10 is an output terminal.

Digital signals applied to the input terminal 1 are input to the phase comparator 2, and its phase is compared with the phase of the output signal of the frequency divider 9. The comparison output of the phase comparator 2 is passed through the low-pass filter 3 where high-frequency components are removed, and is applied to the control circuit 4. The output signal of the oscillator 5 is input to the tapped delay circuit 6, which delays the output signal of the oscillator 5 within the range of 360°, and the signals having successively larger phase delays are output from the plurality of intermediate taps. For instance, eight signals are produced and the difference in phase delay between the successive signals is 45°. The taps of the tapped delay circuit 6 are connected to the selection circuit 7. In accordance with the command from the control circuit 4, the selection circuit 7 selects one of the taps and connect the selected tap to its output, and the output signal from the selected tap is supplied to the frequency divider 9. That is, when the phase of the digital signal applied to the input terminal 1 is leading relative to the signal output from the output terminal 10, i.e., the output signal of the frequency divider 9, to advance the phase of the output signal of the frequency divider 9, the selection circuit 7 is switched to a tap producing a signal having a smaller phase delay than the signal that is currently selected. Accordingly, a signal having a phase leading the currently selected signal is supplied from the selection circuit 7 to the frequency divider 9. If it is still necessary to further advance the phase even when the tap having the smallest delay has been reached, then the tap having the largest delay is selected. The number n of the taps is related to the phase difference $\theta$ between adjacent taps as follows:

$$n = 360°/\theta$$

Switching to the tap having the largest delay (having the phase $n\theta$) will result:

$$\theta - (n\theta) = \theta - 360° = \theta$$

Thus, the difference in angle is again $\theta$, and the continuity of the phase variation is maintained. In this way, the phase of the signal to the frequency divider 9 is advanced a predetermined angle at a time until the phase of the input digital signal and the phase of the output signal of the frequency divider 9 coincide with each other. The operation for retarding the phase is similar.

During switching of the phase, the signal currently selected and the signal to be selected next have different digital values of "1" and "0", hazard occurs in the output signal because of the phase switching, and the operation of the frequency divider 9 is interfered. For instance, in FIG. 3, (A), (B), (D) and (F) are waveforms being concurrently output from the taps of the tapped delay circuit 6. (A) and (D) are waveforms of the signal currently selected before the phase switching (hereinafter referred to as waveforms before switching). (B) and (E) are waveforms of the signals which are to be selected after the phase switching (hereinafter referred to as waveforms after switching). (C) and (F) are waveforms of the output of the selection circuit 7. T1 and T2 denote the timing at which the switches of the selection circuit are operated. In the case of FIG. 3, the waveform before switching (A) and the waveform of after switching (B) have different digital values "1" and "0", and the output waveforms is associated with a hazard before and after the timing T1, as shown by (C). Accordingly, if the frequency divider 9 performs the frequency-division by counting the leading edges of the input waveform, an erroneous frequency-division will occur due to the hazard. If the switching takes place at timing T2 when the waveforms before switching (D) and the waveforms after switching (E) have identical digital values "1" and "0", no hazard will occur. The delay circuit 8 shown in FIG. 2 is provided for determining this timing. For instance, if the difference between the successive taps of the tapped delay circuit 6 is 45°, the waveforms after the switching is either 45° leading or 45° lagging, as shown in FIG. 4 at (H) and (I), relative to the waveform before switching shown at (H). Accordingly, if the switching is effected at a timing 90° lagging behind the leading edge of the waveform before the switching, the hazard can be avoided. In this case, the delay circuit 8 is set to have a phase delay of 90° of the input signal. The delay circuit 8 is normally in the digital type.

With the above-described digital PLL device, when the operating frequency is increased and high-speed operation is required, the operation delay time at each part imposes a limitation. For instance, due to the delay time of the selection circuit 7, the control circuit 4 and the delay circuit 8 shown in FIG. 2 (this overall delay time will hereinafter referred to as loop delay time), the phase switching timing $T_3$ lags as shown in FIG. 4. In the example shown in FIG. 4, when the loop delay time exceeds the time corresponding to 45°, hazard as shown at (C) in FIG. 3, and the frequency divider 9 operates erroneously, and the overall operation becomes inappropriate. The maximum operation frequency of the digital PLL device is therefore limited by the loop delay time corresponding to 45°.

SUMMARY OF THE INVENTION

An object of the present invention is to eliminate the above problems, and to provide a high-speed PLL device which operates correctly despite the aforementioned hazard which may occur, and further, where the allowable value of the loop delay time is lengthened so that the operation frequency is increased.

To attain the above object, a high-speed digital PLL device of this invention comprises:

a tapped delay timer producing a plurality of signals which have phases different from each other;

a selection circuit for selectively outputting the output signals of the tapped delay circuit;

a frequency divider for frequency-dividing the output signal of the selection circuit;

a phase comparator for comparing the phases of the input digital signal and the output signal of the frequency divider;

a control circuit for controlling the signal selection of the selection circuit in accordance with the output of the phase comparator, so as to make the phase of the output signal of the frequency-divider to coincide with the input digital signal;

a low-pass filter for removing the hazard that is generated in the selection circuit; and a waveform shaping circuit for shaping the waveform of the output signal of the low-pass filter into rectangular waveform.

The phases of the input digital signal and the output signal of the frequency-divider are compared. The control circuit gives an instruction to the selection circuit such that, if, as a result of the comparison, the phase of the output signal of the frequency-divider is lagging behind the input digital signal, the signal leading the currently selected signal is selected for output, if the phase of the output signal of the frequency-divider is leading the input digital signal, the signal lagging behind the currently selected signal is selected for output. In accordance with this instruction, the selection circuit operates the switches to select the desired signal out of the plurality of signals output from the tapped delay circuit. The low-pass filter removes any hazard which may be contained in the output of the selection circuit. The waveform shaping circuit shapes the output of the low-pass filter into rectangular waves and supplies it to the frequency divider.

With the above arrangement, the effect of the hazard is eliminated, and the device operates properly even at a high operating frequency.

DETAILED DESCRIPTION OF THE PREFERRED EMBODIMENTS

Figure 1:
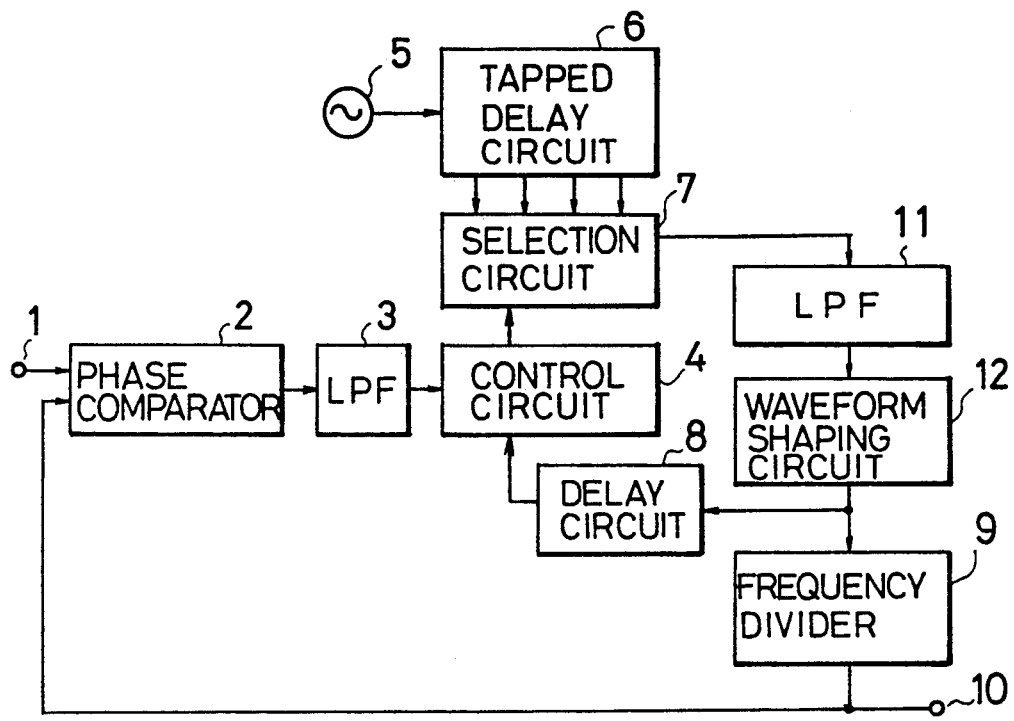
FIG. 1 is a block diagram showing an embodiment of the present invention.

FIG. 1 is a block diagram showing an embodiment of the invention. Reference numeral 11 denotes an analog low-pass filter (LPF), and reference numeral 12 denotes a waveform shaping circuit. Other members are denoted by the same reference numerals as in FIG. 2 and are equivalent to those in FIG. 2.

Figure 5:
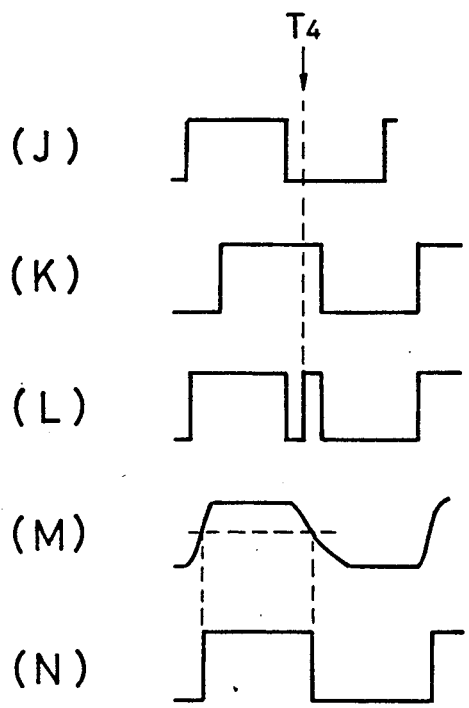
FIG. 5 is a waveform diagram at various parts in FIG. 1.

The operation of the present embodiment will now be described with reference to FIG. 5. FIG. 5 shows the waveforms at various parts in the device of FIG. 1. (J) shows the waveforms of the signal selected by the selection circuit 7 before the phase switching. (K) shows the waveforms of the signal to be selected by the selection circuit 7 by the phase switching. (L) shows the waveform of the output signal of the selection circuit 7 after the phase switching. (M) shows the waveform of the output signal of the LPF 11. (N) shows the waveform of the output signal of the waveform circuit 12.

Figure 2:
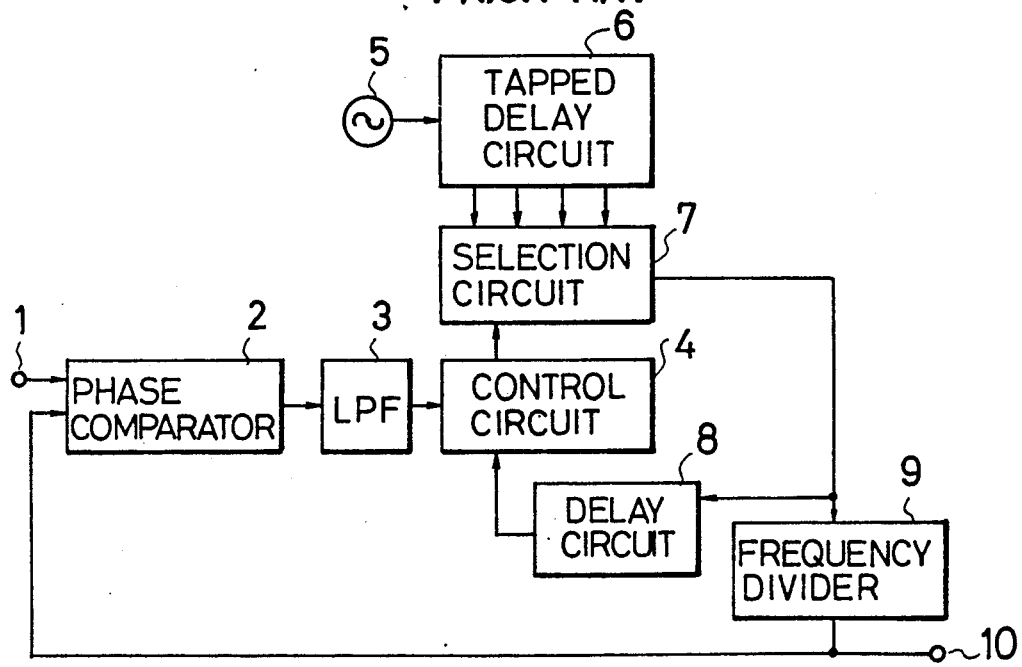
FIG. 2 is a block diagram showing a conventional digital PLL device.
Figure 3:
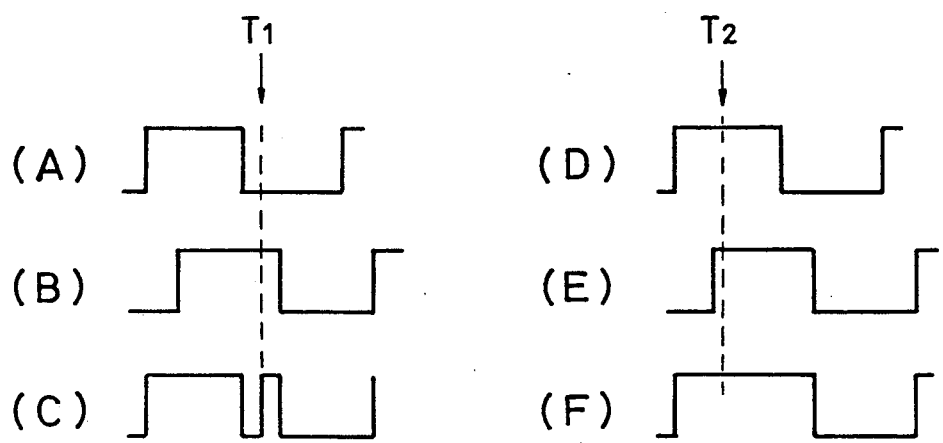
FIG. 3 shows waveforms of inputs and outputs of the selection circuit.
Figure 4:
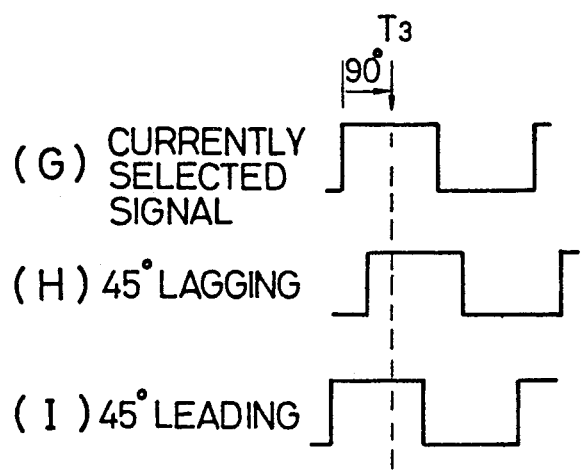
FIG. 4 is a waveform diagram showing inputs to the selection circuit in the case where the output of the tapped delay circuit 5 have 45° phase differences.

In the present embodiment, as shown in FIG. 1, the LPF 11 and the waveform shaping circuit 12 are added on the output side of the selection circuit 7 of the conventional PLL device sown in FIG. 2. The basic operation of the PLL device is identical to the case of FIG. 2.

In FIG. 1, when the phase of the signal output from the output terminal 10, i.e., the output signal of the frequency divider 9 is lagging behind the digital signal input to the input terminal 1, the control circuit 4 instructs the selection circuit to advance the phase of the output signal. In accordance with this instruction, the selection circuit 7 selects, from among the plurality of signals from the tapped delay circuit 6, the signal leading, in phase, the signal that is currently selected, and supplies it to the LPF 11. Similarly, when the signal output from the output terminal 10 is leading the input digital signal, the selection circuit 7 supplies the signal lagging, in phase, behind the signal that is currently selected, to the LPF 11. In this way, the signal output from the output terminal 10 is kept in phase with the digital signal input to the input terminal 1.

When the operating frequency becomes high, due to the loop delay time, the switching timing of the selection circuit 7 is delayed. If the switching is made at the timing $T_4$ with respect to the currently selected signal shown in FIG. 5 at (J) and the signal to be selected next that is shown in FIG. 5 at (K), hazard occurs in the output waveform of the selection circuit 7. The signal containing the hazard is input to the LPF 11. The LPF 11 smoothes out the hazard part as shown in FIG. 5 at (M). The waveform shaping circuit 12 changes the output signal of the LPF 11 into a rectangular wave suitable to digital circuit operation, and supplies it to the frequency divider 9 and the delay circuit 8.

As has been described, according to the present embodiment, even if the switching timing of the selection circuit 7 is delayed due to the loop delay time, and the output waveform of the selection circuit 7 contains a hazard, the LPF 11 and the waveform shaping circuit 12 remove the hazard, and the circuit does not operate erroneously. The operation frequency is therefore not limited by the loop delay time.

For convenience of explanation, the delay circuit 8 is used to provide the fixed timing for the switching. However, it is not necessary to make the switching timing constant, because of the action of the LPF 11 and the waveform shaping circuit 12, so the delay circuit 8 may be omitted.

Figure 6:
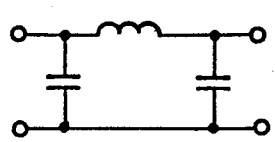
FIG. 6 is a circuit diagram showing an analog low-pass filter.

FIG. 6 shows an example of the analog low-pass filter (LPF) 11 shown in FIG. 1. The cut-off frequency of this analog low-pass filter will be considered. If the phase of the output signal of the tapped delay circuit 6 shown in FIG. 1 is 45°, one cycle of hazard occurs within 45° as shown in FIG. 5 at (L). The frequency of the hazard is therefore:

$$360°/45°=8$$

That is, the frequency is eight times the frequency of the signal output from the selection circuit 7. The analog low-pass filter is required to adequately suppress the frequency components which are eight times higher. So, the cut-off frequency may be set at four to six times the frequency of the output of the selection circuit 7. When the phase difference between the output signals of the tapped delay circuit 6 is other than 45°, the cut-off frequency may be decided in the same way as described above.

Figure 7:
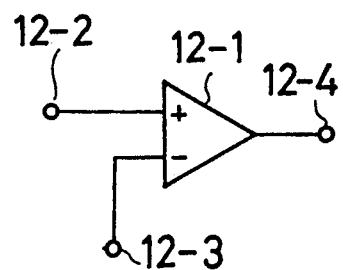
FIG. 7 is a circuit diagram showing the waveform shaping circuit.

FIG. 7 shows an example of the waveform shaping circuit 12 shown in FIG. 1. Reference numeral 12-1 denotes an analog comparator, 12-2 denotes an input terminal, 12-3 denotes a reference input terminal, 12-4 denotes an output terminal. Applied to the reference input terminal 12-3 is a voltage having a value intermediate between the upper limit voltage and the lower limit voltage of the output signal of the analog low-pass filter (LPF) 11 shown in FIG. 5 at (M). The analog comparator 12-1 produces a digital "1" to the output terminal 12-4 if the signal input to the input terminal 12-2 exceeds the above-mentioned voltage. The analog comparator 12-1 produces a digital "0" to the output terminal 12-4 if the signal input to the input terminal 12-2 does not exceed the above-mentioned voltage. It thus shapes the input wave into desirable wave.

As has been described, according to the invention, a low-pass filter and a waveform shaping circuit are provided on the output side of the selection circuit, so the problem of hazard due to the switching is eliminated, and the limit to the loop delay time has been removed. The digital PLL device can therefore be used in high-speed applications.

What is claimed is:

1. A high-speed digital PLL device for producing a signal in synchronism with the phase of an input digital signal, comprising:
   a tapped delay timer producing a plurality of signals which have phases different from each other;
   a selection circuit for selectively outputting the output signals of the tapped delay circuit;
   a frequency divider for frequency-dividing the output signal of the selection circuit;
   a phase comparator for comparing the phases of the input digital signal and the output signal of the frequency divider;
   a control circuit for controlling the signal selection of the selection circuit in accordance with the output of the phase comparator, so as to make the phase of the output signal of the frequency-divider to coincide with the input digital signal;
   a low-pass filter for removing a hazard that is generated in the selection circuit; and
   a waveform shaping circuit for shaping the waveform of the output signal of the low-pass filter into rectangular waveform.

2. The device of claim 1, further comprising an oscillator, said tapped delay circuit receiving the output of said oscillator.

3. The device of claim 1, wherein the outputs of said tapped delay circuit have phases shifted successively by the same phase difference.

4. The device of claim 1, wherein said control circuit causes the selection circuit to select the output of the tapped delay circuit that is leading, in phase, the output that is currently selected when the output of the frequency divider is found to be lagging behind the phase of the input signal, and said control circuit causes the selection circuit to select the output of the tapped delay circuit that is lagging, in phase, behind the output that is currently selected when the output of the frequency divider is found to be leading the phase of the input signal.

5. The device of claim 1, wherein the cut-off frequency of the low-pass filter is higher than the maximum frequency of the output of the selection circuit and is lower than the lowest frequency of the hazard.

6. The device of claim 1, wherein the outputs of said tapped delay circuit have phases shifted successively by the same phase difference, and the phase difference between the successive outputs of the tapped delay circuit is 45°, and the cut-off frequency of the low-pass filter is four to six times the frequency of the maximum frequency of the outputs of the selection circuit.

7. The device of claim 1, further comprising an additional delay circuit responsive to the output of said waveform shaping circuit and producing a signal phase-shifted relative to the output of said waveform shaping circuit; said control circuit being responsive to the said signal from said additional delay circuit and switching from a state in which one of the output signals of the selection circuit is selected, to another state in which another output signal of the selection circuit is selected, at a timing determined by said signal from said additional delay circuit.

* * * * *